(12) United States Patent
Huang et al.

(10) Patent No.: US 10,297,619 B2
(45) Date of Patent: May 21, 2019

(54) ARRAY SUBSTRATE

(71) Applicant: Au Optronics Corporation, Hsinchu (TW)

(72) Inventors: Kun-Lung Huang, Taichung (TW); Ping-Hung Shih, New Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 15/851,700

(22) Filed: Dec. 21, 2017

(65) Prior Publication Data

US 2019/0051668 A1 Feb. 14, 2019

(30) Foreign Application Priority Data

Aug. 10, 2017 (TW) .............................. 106127011 A (51) Int. Cl.
*H01L 27/12* (2006.01)
*H01L 27/32* (2006.01)
*H01L 27/02* (2006.01)

(52) U.S. Cl.
CPC ........ *H01L 27/124* (2013.01); *H01L 27/0296* (2013.01)

(58) Field of Classification Search
CPC ............... H01L 27/124; H01L 27/3297; H01L 27/3276; H01L 27/3288
See application file for complete search history.

(56) References Cited

U.S. PATENT DOCUMENTS

| | | | |
|---|---|---|---|
| 5,305,130 A | 4/1994 | Yamawaki | |
| 7,372,514 B2 * | 5/2008 | Matsumoto | ....... G02F 1/136204 349/149 |
| 9,418,582 B2 | 8/2016 | Chang et al. | |
| 2001/0028418 A1 | 10/2001 | Ozaki et al. | |
| 2002/0109814 A1 * | 8/2002 | Murahashi | .......... G02F 1/13452 349/151 |
| 2016/0070130 A1 * | 3/2016 | Yuminami | .......... G02F 1/13452 349/110 |
| 2016/0078792 A1 | 3/2016 | Chang et al. | |
| 2016/0225787 A1 * | 8/2016 | Katsuta | ................. H01L 27/124 |

FOREIGN PATENT DOCUMENTS

| | | |
|---|---|---|
| CN | 203643725 | 6/2014 |
| JP | H1096940 | 4/1998 |
| TW | 565813 | 12/2003 |
| TW | I540323 | 7/2016 |

* cited by examiner

*Primary Examiner* — Michele Fan
(74) *Attorney, Agent, or Firm* — JCIPRNET (57) ABSTRACT

An array substrate includes a substrate, first signal lines, sub-pixels, reference potential lines, first bonding pads, second bonding pads, first fan-out lines, second fan-out lines, first connection lines, second connection lines, and a first reference potential line. An accommodation space exists between a first connection line closest to the second bonding pads and a second connection line closest to the first bonding pads. The first reference potential line is disposed in the accommodation space and electrically connected with the reference potential lines.

15 Claims, 5 Drawing Sheets

ARRAY SUBSTRATE

CROSS-REFERENCE TO RELATED APPLICATION

This application claims the priority benefit of Taiwan application serial no. 106127011, filed on Aug. 10, 2017. The entirety of the above-mentioned patent application is hereby incorporated by reference herein and made a part of this specification.

BACKGROUND OF THE DISCLOSURE

1. Field of the Disclosure

The disclosure relates to an array substrate, and particularly relates to an array substrate having a reference potential line.

2. Description of Related Art

With the continuous development through time, the demands of the market on the resolution of display panels become higher and higher. In order to accomplish a display panel having a higher resolution, the density of data lines needs to be increased. However, if the data lines are too dense, there may not be enough space for other signal lines. Moreover, the resolution of the display panel may not be able to increase due to difficulties in wiring or lack of space in an array substrate of the display panel.

SUMMARY OF THE DISCLOSURE

At least one embodiment of the disclosure provides an array substrate. The array substrate includes a substrate, first signal lines, sub-pixels, reference potential lines, a first bonding pad group, a second bonding pad group, first fan-out lines, second fan-out lines, first connection lines, second connection lines, and a first reference potential line. The substrate has an active region and a peripheral region located at at least one side of the active region. The first signal lines, the sub-pixels, and the reference potential lines are located at the active region. The sub-pixels are respectively electrically connected to the first signal lines. The first bonding pad group, the second bonding pad group, the first fan-out lines, and the second fan-out lines are located at the peripheral region. The first bonding pad group has a plurality of first bonding pads. The second bonding pad group has a plurality of second bonding pads. The first fan-out lines and the second fan-out lines are respectively electrically connected to the first bonding pads and the second bonding pads. The first connection lines electrically connect the first fan-out lines to the corresponding first signal lines. The second connection lines electrically connect the second fan-out lines to the corresponding first signal lines. An accommodation space is provided between the first connection line closest to the second bonding pads and the second connection line closest to the first bonding pads. The first reference potential line is disposed in the accommodation space and electrically connected with the reference potential lines.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

In the following, several embodiments of the disclosure are disclosed with reference to the drawings. To describe more clearly, some details in practice will also be described in the following. However, such details in practice shall not be construed as limitations on the disclosure. In other words, in some embodiments of the disclosure, these details in practice are not required. Moreover, to simplify the drawings, some conventional/well-known structures and devices will be simplified in the drawings.

It will be understood that when an element such as a layer, film, region, or substrate is referred to as being "on" or "connected to" another element, it can be directly on or connected to the other element or intervening elements may also be present. In contrast, when an element is referred to as being "directly on" or "directly connected to" another element, there are no intervening elements present. As used herein, "connected" may refer to a physical and/or electrical connection. Moreover, "electrical connection" or "coupled to" can be has another element exists between two elements.

It should be understood that, while the terms such as "first" and "second" may be used to describe various components, parts, regions, layers and/or portions, such components, parts, regions, layers and/or portions shall not be limited by such terms. These terms only serve to separately define a component, a part, a region, a layer, and/or a portion from another component, another part, another region, another layer, and/or another portion. Therefore, the "first" component, part, region, layer, or portion in the following may also be referred to as the "second" component, part, region, layer, or portion without departing from the spirit of the disclosure.

The terms are used herein merely for the purpose of describing a specific embodiment and shall not be restrictive. As used in the text, unless the context clearly indicates otherwise, singular terms such as "a", "one", and "the" are intended to cover plural forms and include "at least one". Also, "or" represents "and/or". As used in the text, the term "and/or" includes any and all of the combinations of one or more enumerated relevant items. It should also be understood that, when used in the specification, terms such as "comprise" and/or "include" specifically refer to the presence of a feature, a region, a whole part, a step, an operation, a component, and/or a part, but does not exclude the presence or addition of one or more other features, whole regions, steps, operations, components, parts, and/or a combination thereof.

Moreover, relative terms such as "below" or "bottom" and "above" or "top" may serve to describe the relation between one component and another component in the text according to the illustration of the drawings. It should also be understood that the relative terms intend to include different orientations of an apparatus in addition to the orientation shown in the drawings. For example, if an apparatus in the drawings is flipped, a component described as being disposed to be "lower" than other components shall be orientated again to be "higher" than other components. Thus, the exemplary term "lower" may cover the orientations of "lower" and "higher", depending on a specific orientation of the drawings. Similarly, if an apparatus in the drawings is flipped, a component described as being "below" other components may be orientated again to be "above" other components. Thus, the exemplary term "lower" may cover the orientations of "above" and "below".

The terms used herein such as "about" or "substantial" include a related value and an average within an acceptable deviation range of specific values determined by those with ordinary skills in the art with consideration of discussed measurement and a specific number of errors related to the measurement (i.e., a limitation of a measurement system). For example, the term "about" represents to be within one or a plurality of standard deviations of the related value, or within 30%, 20%, 10%, 5%. Moreover, an acceptable range of deviation or standard deviation may be chosen for the terms "about" or "substantial" used herein based on optical properties, etching properties, or other properties, instead of applying one standard deviation across all the properties.

Terms such as "first conductive layer", "second conductive layer", and "third conductive layer" used herein may respectively refer to layers formed in different processes. The "first conductive layer" is formed on the substrate earlier than the "second conductive layer" and the "second conductive layer" is formed on the substrate earlier than the "third conductive layer". Terms such as "single-layer conductive structure" used herein refer to a structure including one of the "first conductive layer", the "second conductive layer" and the "third conductive layer", and terms such as "double-layer conductive structure" used herein refer two of the "first conductive layer", the "second conductive layer" and the "third conductive layer".

Figure 1A:
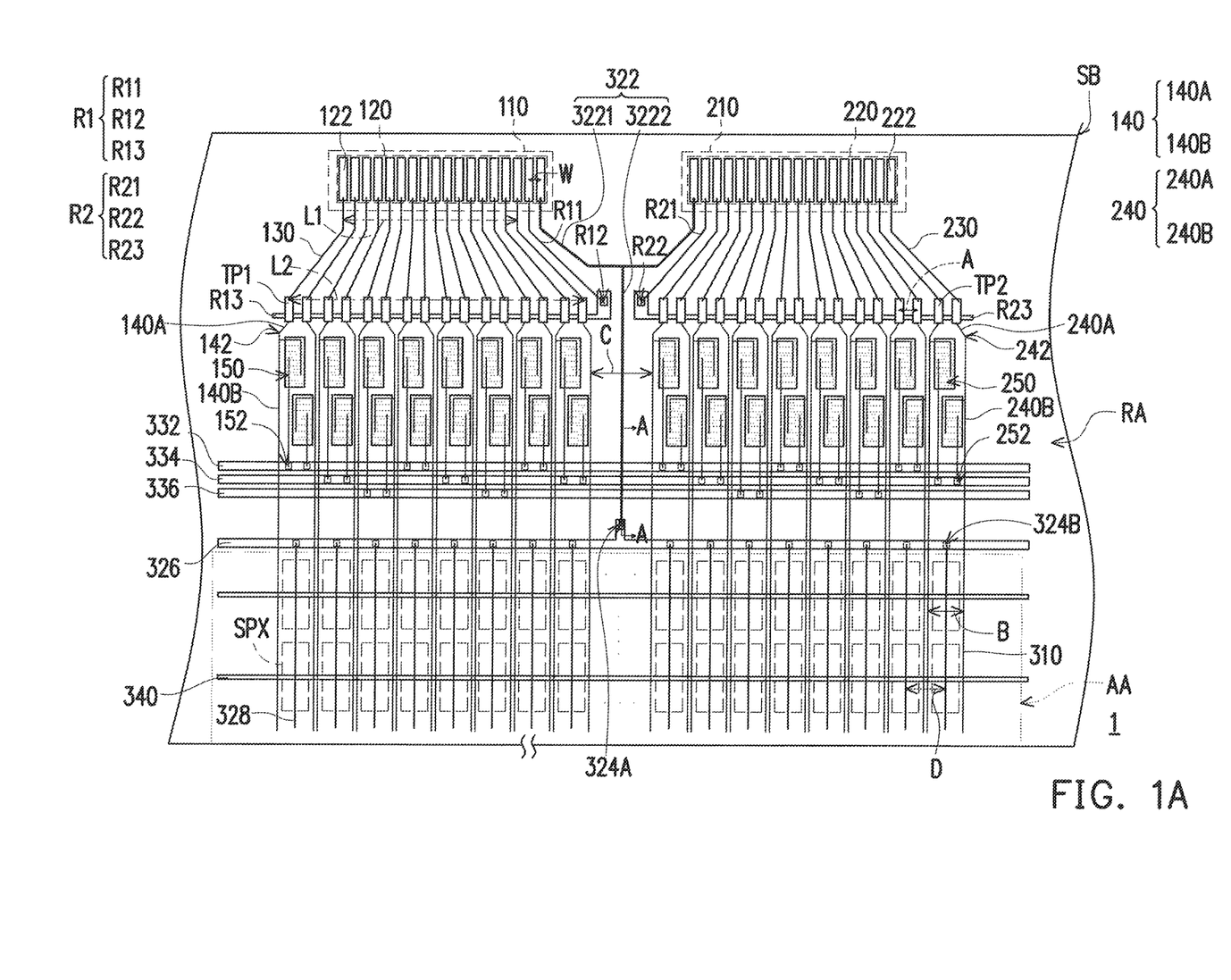
FIG. 1A is a schematic view illustrating an array substrate according to an embodiment of the disclosure.
Figure 1B:
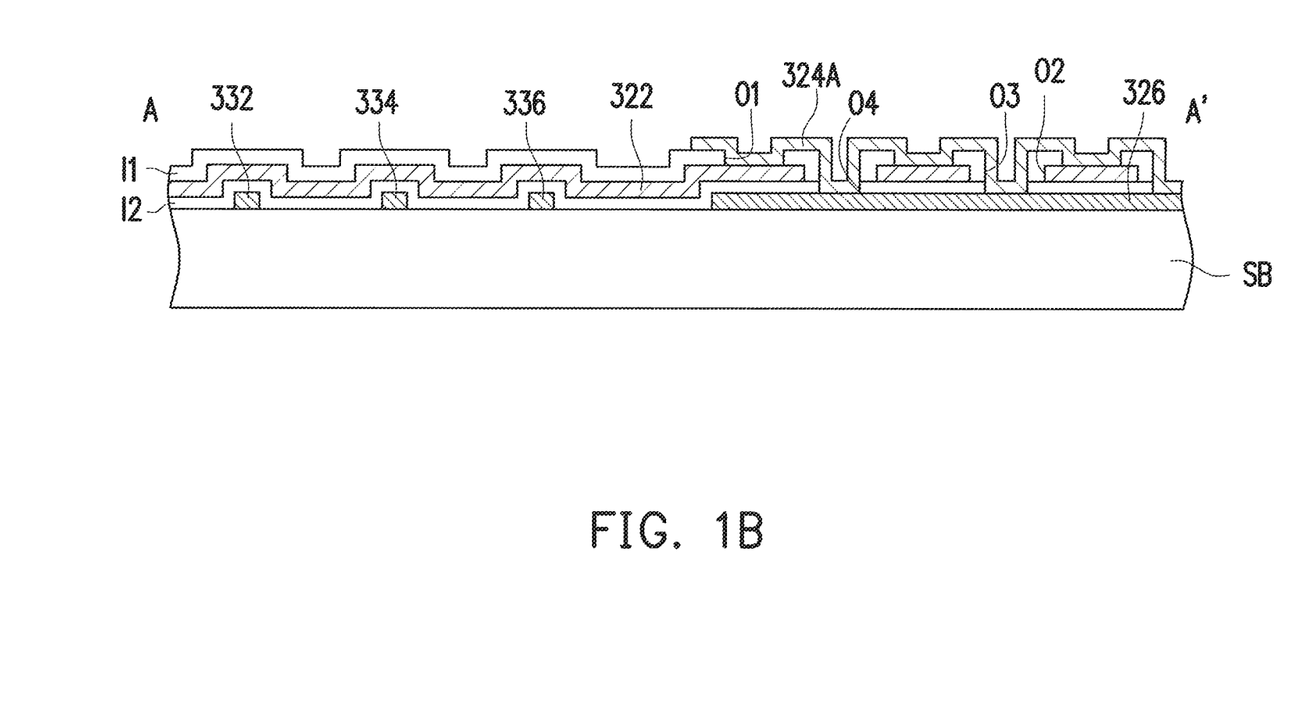
FIG. 1B is a schematic cross-sectional view taken along a line AA' of FIG. 1A.
Figure 1C:
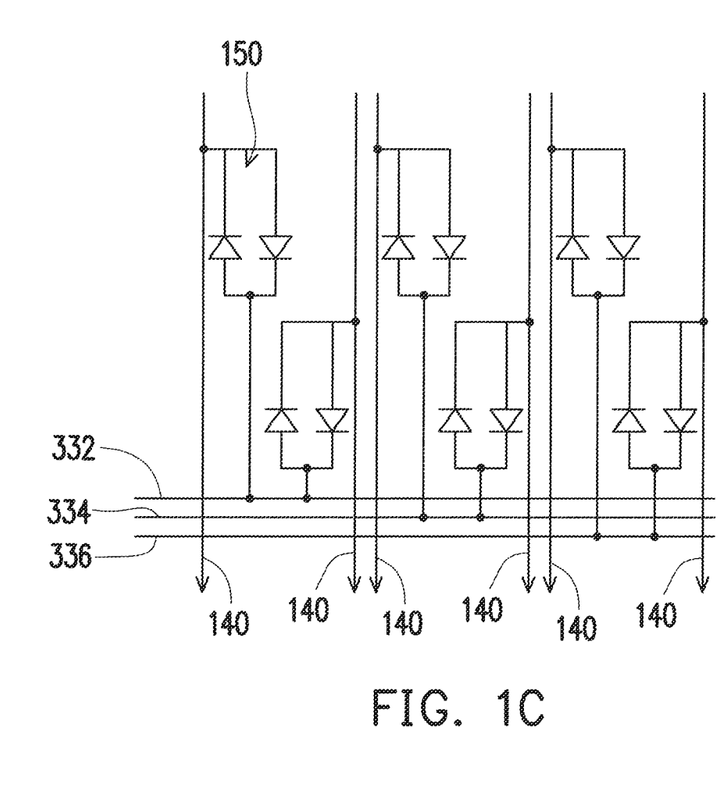
FIG. 1C is a partial circuit layout view of FIG. 1A.

FIG. 1A is a schematic view illustrating an array substrate according to an embodiment of the disclosure. FIG. 1B is a schematic cross-sectional view taken along a line AA' of FIG. 1A. FIG. 1C is a partial circuit layout view of FIG. 1A.

Referring to FIGS. 1A and 1B, an array substrate 1 includes a substrate SB, a plurality of first signal lines 310, a plurality of sub-pixels SPX, a plurality of reference potential lines 328, a first bonding pad group 120, a second bonding pad group 220, a plurality of first fan-out lines 130, a plurality of second fan-out lines 230, a plurality of first connection lines 140, a plurality of second connection lines 240, and a first reference potential line 322.

The substrate SB has an active region AA and a peripheral region RA located on at least one side of the active region AA. For example, the first signal lines 310 and the sub-pixels SPX, and the reference potential lines 328 are located on the active region AA, and the first bonding pad group 120, the second bonding pad group 220, the first fan-out lines 130, the second fan-out lines 230, the first connection lines 140, the second connection lines 240, and the first reference potential line 322 are located on the peripheral region RA.

The first bonding pad group 120 and the second bonding pad group 220 are located on the peripheral region RA of the substrate SB. The first bonding pad group 120 has a plurality of first bonding pads 122. The second bonding pad group 220 has a plurality of second bonding pads 222. A distance between centers of adjacent first bonding pads 122 or adjacent second bonding pads 222 is W, and W is in a range from about 30 micrometers to about 52 micrometers, for example. However, the disclosure is not limited thereto.

In the embodiment, the array substrate 1 may optionally further include a first driving circuit 110 and a second driving circuit 210. The first driving circuit 110 is electrically connected to the first bonding pad group 120. The second driving circuit 210 is electrically connected to the second bonding pad group 220. In one embodiment, the first driving circuit 110 and the second driving circuit 210 are a gate driving circuit or a source driving circuit, for example. At least one of the first driving circuit 110 and the second driving circuit 210 includes an integrated circuit chip and/or a flexible circuit board. For example, if at least one of the first driving circuit 110 and the second driving circuit 210 is an integrated circuit chip and is electrically connected to the first bonding pad group 120 or the second bonding pad group 220, the integrated circuit chip is only disposed on the substrate SB. Alternatively, if at least one of the first driving circuit 110 and the second driving circuit 210 is an integrated circuit chip disposed on a flexible circuit board and is electrically connected to the first bonding pad group 120 or the second bonding pad group 220, the flexible circuit board is partially disposed on the substrate SB. In FIGS. 1A and 2A, the example where the integrated circuit chip is only disposed on the substrate SB is shown. However, the disclosure is not limited thereto.

The first fan-out lines 130 and the second fan-out lines 230 are located on the peripheral region RA of the substrate SB. One ends of the first fan-out lines 130 are electrically connected to the corresponding first bonding pads 122. One ends of the second fan-out lines 230 are electrically connected to the corresponding second bonding pads 222.

In one embodiment, a portion of the first reference potential line 322 is located between the first fan-out lines 130 and the second fan-out lines 230. In one embodiment, the first reference potential line 322 is substantially Y-shaped. The first reference potential line 322 is connected to one of the first bonding pads 122 and one of the second bonding pads 222. In some embodiments, the first reference potential line 322 includes a connecting branch 3221 and a bus line 3222. The connecting branch 3221 is serially connected with the first bonding pad 122 closest to the second bonding pad group 220 and the second bonding pad 222 closest to the first bonding pad group 120. Moreover, the connecting branch 3221 is connected to the bus line 3222. Since the first reference potential line 322 is connected to one of the first bonding pads 122 as well as one of the second bonding pads 222, the first driving circuit 110 and the second driving circuit 210 are able to jointly control a signal applying a common signal (COM) or a substantially fixed potential to the first reference potential line 322. Therefore, the signal of the first reference potential line 322 is substantial more stable, and the substantially fixed potential is also adjustable based on practical needs. However, the disclosure is not limited thereto. The first reference potential line 322 may also be a floating signal. People having ordinary skills in the art may provide a potential of the first reference potential line 322 based on practical needs. The first reference potential line 322 includes a double-layer conductive structure, a single-layer conductive structure, or a combination thereof, for example.

The first signal lines 310 are located on the active region AA of the substrate SB. In one embodiment, the first signal lines 310 extend from the peripheral region RA to the active region AA of the substrate SB. In an embodiment, the first signal lines 310 are substantially parallel to each other. The first signal lines 310 are formed as straight shape, substantially straight shape, substantially zigzag shape, or zigzag shape, for example, but not limited it's shape. The first signal lines 310 are scan lines or data lines, for example, but not limited it's the signals. In FIGS. 1A and 2A, the first signal lines 310 are data lines, for example, but not limited it's. In other embodiments, the first signal lines 310 may also be scan lines. In some embodiments, if the array substrate 1 further includes a plurality of second signal lines 340, the first signal lines 310 may have a function different from that of the second signal lines 340. For example, the first signal lines 310 may be data lines, while the second signal lines 340 may be scan lines.

The first connection lines 140 are respectively located between the corresponding first signal lines 310 and the corresponding first fan-out lines 130. The first connection lines 140 electrically connect the first fan-out lines 130 to the corresponding first signal lines 310. In one embodiment, the first connection line 140 includes a first connection portion 140A closer to the first fan-out line 130 and a first extension portion 140B connected to the first connection portion 140A. The first extension portion 140B is located between the first connection portion 140A and the corresponding first signal line 310. The first extension portions 140B are substantially parallel to each other. In an embodiment, a turning angle (or namely bending angle) 142 is provided between the first connection portion 140A and the first extension portion 140B. In an embodiment, the turning angles 142 of two adjacent first connection lines 140 have substantial mirror pattern to each other or substantial mirror symmetrical pattern to each other.

The second connection lines 240 are respectively located between the corresponding first signal lines 310 and the corresponding second fan-out lines 230. The second connection lines 240 electrically connect the second fan-out lines 230 to the corresponding first signal lines 310. In one embodiment, the second connection line 240 includes a second connection portion 240A closer to the second fan-out line 230 and a second extension portion 240B connected to the second connection portion 240A. The second extension portion 240B is located between the second connection portion 240A and the corresponding first signal line 310. The second extension portions 240B are substantially parallel to each other. The second extension portions 240B are substantially parallel to the first extension portions 140B, for example. In an embodiment, a turning angle (or namely bending angle) 242 is provided between the second connection portion 240A and the second extension portion 240B. In an embodiment, the turning angles 242 of two adjacent second connection lines 240 have substantial mirror pattern to each other, or substantial mirror symmetrical pattern to each other.

An accommodation space C is provided between the first connection line 140 closest to the second bonding pads 222 and the second connection line 240 closest to the first bonding pads 122. A portion of the first reference potential line 322 is located in the accommodation space C. For example, the bus line 3222 is located in the accommodation space C. In an embodiment, a width of the accommodation space C is about 60 micrometers to about 110 micrometers.

In one preferred embodiment, the array substrate 1 may optionally further includes transfer pads TP1 and TP2 located on the peripheral region RA. In the embodiment, the transfer pads TP1 and TP2 may be a single-layer conductive structure or a multi-layer conductive structure. A portion of the transfer pads TP1 are located between the corresponding first connection lines 140 and the corresponding first fan-out lines 130. A portion of the transfer pads TP2 are located between the corresponding second connection lines 240 and the corresponding second fan-out lines 230. In one embodiment, a distance between the centers of the adjacent transfer pads TP1 or the centers of the adjacent transfer pads TP2 is A. In the embodiment, A is about 40 micrometers to about 55 micrometers, for example. However, the disclosure is not limited thereto.

In some embodiments, the first connection lines 140 may be electrically connected to the first fan-out lines 130 through the portion of the transfer pads TP1. One ends of the first fan-out lines 130 are connected to the first bonding pad group 120, and the other ends of the first fan-out lines 130 are connected to the portion of the transfer pads TP1.

In some embodiments, the second connection lines 240 may be electrically connected to the second fan-out lines 230 through the portion of the transfer pads TP2. One ends of the second fan-out lines 230 are connected to the second bonding pad group 220, and the other ends of the second fan-out lines 230 are connected to the portion of the transfer pads TP2.

The ends of the first fan-out lines 130 connected to the first bonding group 120 have a first fan-out width L1. The other end of the first fan-out lines 130 connected to the portion of the transfer pads TP1 have a second fan-out width L2. In an embodiment, the ends of the second fan-out lines 230 connected to the second bonding pad group 220 also have the first fan-out width L1, and the other ends of the second fan-out lines 230 connected to the portion of the transfer pads TP2 also have the second fan-out width L2. The second fan-out width L2 is greater than the first fan-out width L1.

In an embodiment, the array substrate 1 may further optionally include a first repair line R1 and a second repair line R2 located on the peripheral region RA.

The first repair line R1 includes a first portion R11, a second portion R13, and a contact window R12. The first portion R11 is located between the first fan-out lines 130 and the first reference potential line 322. One end of the first portion R11 is electrically connected to one of the bonding pads 122. For example, one end of the first portion R11 is electrically connected to the first bonding pad 122 corresponding to the first portion R11.

In the embodiment, the first portion R11 and the second portion R13 belong to different conductive layers. For example, the first portion R11 belongs to a second conductive layer, and the second portion R13 belongs to a first conductive layer. In addition, an insulating layer (not shown) may be sandwiched between the first conductive layer and the second conductive layer. Therefore, the first portion R11 and the second portion R13 need to be electrically connected to each other through the contact window R12. In the embodiment, the second portion R13 and the portion of the transfer pad TP1 belong to different conductive layers. For example, the portion of the transfer pad TP1 belongs to a second conductive layer, and the second portion R13 belongs to a first conductive layer. The second portion R13 is partially overlapped with the transfer pad TP1.

In one embodiment, when the first signal line 310 is able to transmit a normal signal, the second portion R13 and the first signal line 310 are separated from each other. When the first signal line 310 is unable to transmit a normal signal (i.e., malfunctioning), the second portion R13 and the corresponding transfer pad TP1 are welded. Accordingly, a signal of the first repair line R1 is able to be transmitted to the corresponding first signal line 310.

The second repair line R2 includes a first portion R21, a second portion R23, and a contact window R22. The first portion R21 is located between the second fan-out lines 230 and the first reference potential line 322. One end of the first portion R21 is electrically connected to one of the second bonding pads 222.

In the embodiment, the first portion R21 and the second portion R23 belong to different conductive layers. For example, the first portion R21 belongs to a second conductive layer, and the second portion R23 belongs to a first conductive layer. In addition, an insulating layer (not shown) may be sandwiched between the first conductive layer and the second conductive layer. Therefore, the first portion R21 and the second portion R23 need to be electrically connected to each other through the contact window R22. In the embodiment, the second portion R23 and the portion of the transfer pad TP2 belong to different conductive layers. For example, the portion of the transfer pad TP2 belongs to a second conductive layer, and the second portion R23 belongs to a first conductive layer. The second portion R23 is partially overlapped with the transfer pad TP2.

In an embodiment, when the first signal line 310 is able to transmit a normal signal, the second portion R23 and the first signal line 310 are separated from each other. When the first signal line 310 is unable to transmit a normal signal (i.e., malfunctioning), the second portion R23 and the corresponding transfer pad TP2 are welded. Accordingly, a signal of the second repair line R2 is able to be transmitted to the corresponding first signal line 310.

In another embodiment, the transfer pad TP1 or TP2 may be a double-layer conductive structure (e.g., a first conductive layer and a second conductive layer), and the transfer pad TP1 or TP2 may further include another contact window (not shown) to serve as a transfer layer of the conductive layers. For example, through the another contact window (not shown) of the transfer pad TP1 or TP2 (the double-layer conductive structure), a signal of the driving circuit 110 or 120 is transmitted from the peripheral region RA into the display region AA through the first conductive layer or the second conductive layer.

Referring to FIGS. 1A to 1C, in an embodiment, the array substrate 1 may optionally further include a plurality of electronic components (or namely electronic devices) 150 and 250 located on the peripheral region RA. The electronic components 150 are located between the first fan-out lines 130 and a portion of the first signal lines 310. The electronic components 250 are located between the second fan-out lines 230 and a portion of the first signal lines 310. In the embodiment, the electronic components 150 and 250 may include an antistatic device, for example. In addition, each electronic components 150 or 250 (ex: antistatic device) includes at least one diode, but not limited it. Taking FIG. 1C as an example, each two electronic components 150 (ex: antistatic devices) are located between adjacent two first connection lines 140 or each two electronic components (ex: antistatic devices) 250 are located between adjacent two second connection lines 240. An end of the electronic device 150 is electrically connected to the corresponding first connection line 140, the first connection line 140 is electrically connected to the corresponding first signal line 310, or an end of the electronic device 250 is electrically connected to the corresponding second connection line 240, and the second connection line 240 is electrically connected to the corresponding first signal line 310. Under such circumstance, the electronic component (ex: antistatic device) is able to prevent a short circuit due to an excessive current of the corresponding first signal line 310. The other end of the electronic device 150 or 250 may be electrically connected to a corresponding conductive wire, such as a first conductive wire 332, a second conductive wire 334, or a third conductive wire 336, through the contact window 152 or 252. In addition, the first conductive wire 332, the second conductive wire 334, and the third conductive wire 336 may have a common potential (COM) or other suitable potentials. However, the disclosure is not limited thereto. In some embodiments, the first connection line 140 and the second connection line 240 may be partially overlapped with the first conductive wire 332, the second conductive wire 334, and the third conductive wire 336. In some embodiments, the electronic device 150 or 250 may include an antistatic device, a numeric symbol, a character, a box in box pattern, other electronic components, or at least one of the foregoing. When the electronic device 150 or 250 is a numeric symbol, the numeric symbol may serve to mark a sequence of manufacturing processes. When the electronic device 150 or 250 is a box in box pattern, the box in box pattern may serve as a positioning marking of a photomask or a measurement.

Referring to FIGS. 1A and 1B, the first reference potential line 322 is partially overlapped with the first conductive wire 332, the second conductive wire 334, and the third conductive wire 336. In one embodiment, the first reference potential line 322 is able to cross the first conductive wire 332, the second conductive wire 334, and the third conductive wire 336. In one embodiment, the first reference potential line 322 includes a double-layer conductive structure and/or a single-layer conductive structure.

Referring to FIGS. 1A and 1B, the first reference potential line 322 may be electrically connected to a second reference potential line 326, for example.

In the embodiment, the first reference potential line 322, the second reference potential line 326, and a conductive structure 324A belong to different conductive layers. For example, the first reference potential line 322 belongs to a second conductive layer, the second reference potential line 326 belongs to a first conductive layer, and the conductive structure 324A belongs to a third conductive layer. An insulating layer I2 is sandwiched between the first conductive layer and the second conductive layer, and an insulating layer I1 is sandwiched between the second conductive layer and the third conductive layer. In the embodiment, the first signal lines 310, the first connection lines 140, and the second connection lines 240 belong to the second conductive layer. The second reference potential line 326 respectively intersects the first signal lines 310, the first connection lines 140, and the second connection lines 240. For example, the second reference potential line 326 is substantially perpendicular to the first signal lines 310, the first connection lines 140, and the second connection lines 240, respectively. Therefore, the second reference potential line 326 crosses the first signal lines 310, the first connection lines 140, and the second connection lines 240.

In the embodiment, the first reference potential line 322 and the second reference potential line 326 are electrically connected to each other through the conductive structure 324A. The insulating layer I2 has a plurality of openings O4 exposing a part of the second reference potential line 326. The first reference potential line 322 has openings O2 substantially corresponding to the openings O4. In addition, a portion of the insulating layer I1 is filled into the openings O2, and the portion of the insulating layer I1 filled into the openings O2 has openings O3. The conductive structure 324A is filled into the openings O3 and O4 and electrically connected to the second reference potential line 326. The insulating layer I1 further includes a plurality of openings O1 exposing the first reference potential line 322. The conductive structure 324A is filled into the openings O1 and electrically connected to the first reference potential line 322. In one embodiment, the openings O1 and the openings O4 (or the openings O3) may be alternately arranged, but not limited it.

If the array substrate 1 includes the first signal lines 310, the second signal lines 340, the sub-pixels SPX, and the reference potential lines 328 located on the active region AA, the sub-pixels SPX may be respectively electrically connected to the corresponding first signal lines 310 and the corresponding second signal lines 340. In one embodiment, the first signal lines 310 and the second signal lines 340 are respectively as data lines and scan lines intersecting each other. The sub-pixel SPX is electrically connected to at least one corresponding data line and at least one corresponding scan line. In the embodiment, a pitch between two adjacent first signal lines is B. Taking a display panel whose size ranges from about 65 inches to about 85 inches as an example, the pitch B may be in a range from about 124 micrometers to 165 micrometers. However, the disclosure is not limited thereto. Taking a display panel whose size ranges from about 65 inches to about 85 inches as an example, there may be a total of 23,040 first signal lines (e.g., data lines) 310 and 1,920 second signal lines (e.g., scan lines) 340. In addition, each color sub-pixel (e.g., a red sub-pixel) is configured with a one-data-line-and-one-gate-line (1D1G) circuit layout. The required number of the first signal lines (e.g., data lines) 310 may be about 8,000 (8K). Under such circumstance, such a display panel may be referred to as an ultra high (8K) definition display panel. However, the disclosure is not limited thereto. Taking a display panel whose size ranges from about 65 inches to about 85 inches as an example, there may be a total of 23,040 first signal lines 310 and 1,920 second signal lines 340, for example. In addition, a color sub-pixel (e.g., a red sub-pixel) is configured with a two-data-line-and-half-gate-line (2DhG) circuit layout. The required number of the first signal lines 310 may be about 4,000 (4K). Under such circumstance, such a display panel may be referred to as a high definition (4K) display panel. However, the disclosure is not limited thereto.

The first reference potential line 322 is electrically connected to the reference potential lines 328 through the second reference potential line 326. In one embodiment, a potential of the reference potential lines 328 may be about 0V. In one embodiment, the reference potential lines 328 may be floating. In one embodiment, a substantially fixed or adjustable potential may be applied to the reference potential lines 328. In the embodiment, the reference potential lines 328 and the first signal lines 310 belong to a second conductive layer, whereas the second reference potential line 326 and the second signal lines 340 belong to a first conductive layer. The second reference potential line 326 is electrically connected to the reference potential lines 328 through contact windows 324B. In one embodiment, each column of the sub-pixels SPX corresponds to one of the reference potential line 328, and a pitch D between two adjacent reference potential lines 328 is about 81 micrometers to about 82 micrometers. However, the disclosure is not limited thereto.

Figure 2:
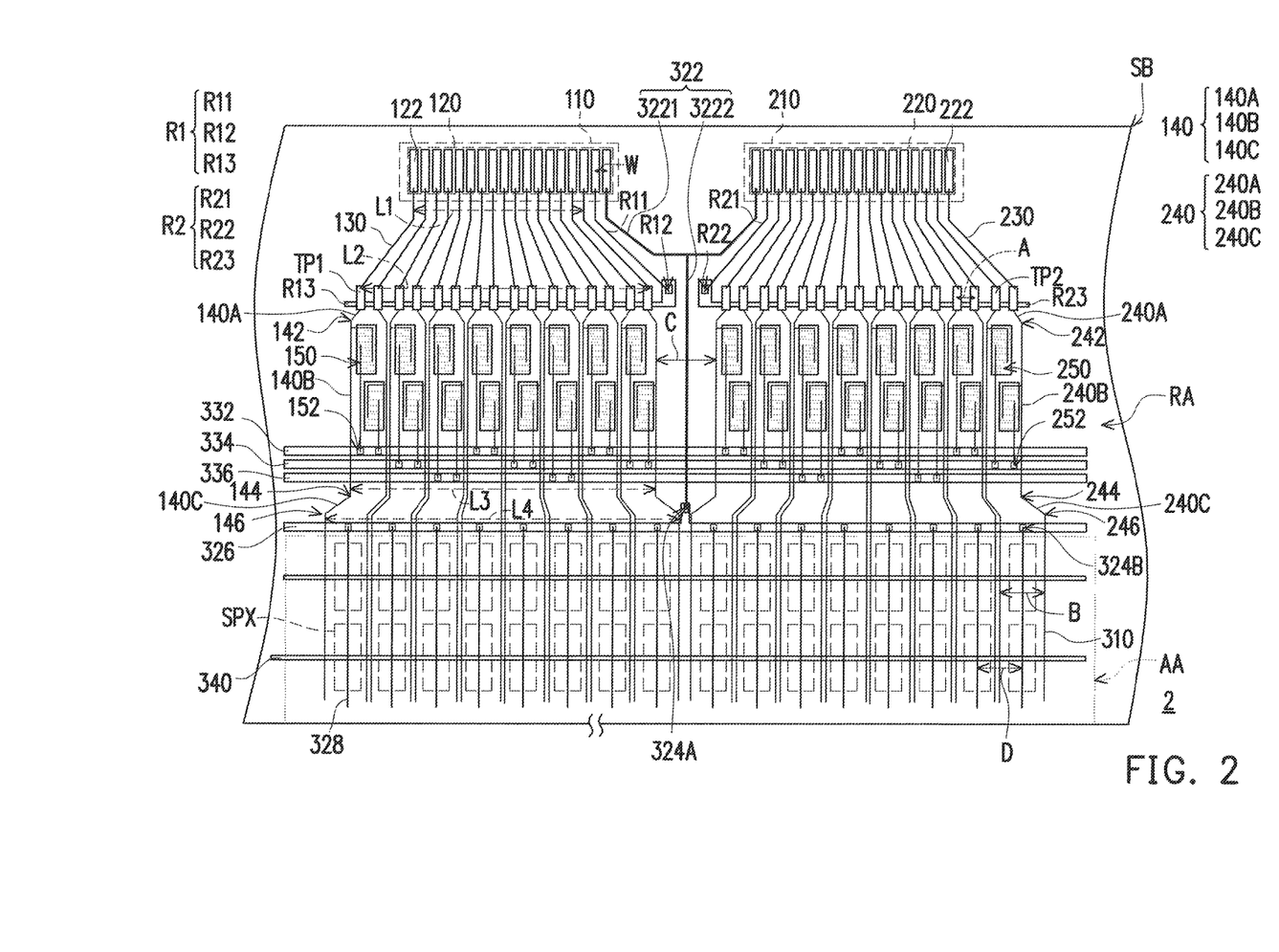
FIG. 2 is a schematic view illustrating an array substrate according to an embodiment of the disclosure.

FIG. 2 is a schematic view illustrating an array substrate according to an embodiment of the disclosure. It should be noted that the reference numerals and a part of the contents in the embodiment of FIGS. 1A to 1C are used in the embodiment of FIGS. 2 and 3, in which identical reference numerals indicate identical or similar components, and repeated description of the same technical contents is omitted. For a detailed description of the omitted parts, reference can be found in the previous embodiment, and no repeated description is contained in the following embodiments.

FIG. 2 mainly differs from FIG. 1A in that the first connection line 140 includes the first connection portion 140A, the first extension portion 140B, and a first turning portion (or namely first bending portion) 140C that are sequentially connected. The first turning portion 140C connects the first extension portion 140B and the corresponding first signal line 310. A portion of the first connection line 140 near the corresponding first signal line 310 has at least two turning angles (or namely at least two bending angles) 144 and 146. In one embodiment, the first turning portion 140C has the turning angle 146, and the first connection line 140 (or the first turning portion 140C of the first connection line 140) is connected to the first signal line 310 above the second reference potential line 326. The turning angle 144 is provided between the first turning portion 140C and the first extension portion 140B. Ends of the first turning portions 140C connected to the first extension portions 140B have a third fan-out width L3. The other ends of the first turning portions 140C connected to the first signal lines 310 have a fourth fan-out width L4.

In the embodiment, the second connection line 240 includes the second connection portion 240A, the second extension portion 240B, and a second turning portion (or namely second bending portion) 240C that are sequentially connected. A portion of the second connection line 240 near the corresponding first signal line 310 has at least two turning angles (or namely at least two bending angles) 244 and 246. In one embodiment, the second turning portion 240C has the turning angle 246, and the second connection line 240 (or the second turning portion 240C of the second connection line 240) is connected to the first signal line 310 above the second reference line 326. The turning angle 244 is provided between the second turning portion 240C and the second extension portion 240B. In one embodiment, ends of the second turning portions 240C connected to the second extension portions 240B also have the third fan-out width L3. The other ends of the second turning portions 240C connected to the first signal lines 310 also have the fourth fan-out width L4. In one embodiment, the fourth fan-out width L4 is greater than the third fan-out width L3. In one embodiment, the third fan-out width L3 is greater than the second fan-out width L2, and the second fan-out width L2 is greater than the first fan-out width L1.

Accordingly, when an array substrate 2 of FIG. 2 and the array substrate 1 of FIG. 1A are applied in a display panel of substantially the same size, the array substrate 2 of FIG. 2 is able to accommodate more sub-pixels SPX in the active region AA than the sub-pixels SPX that the active region AA of the array substrate 1 is able to accommodate. In other words, since the array substrate 2 is more applicable in a high-resolution display panel than the array substrate 1, the active region AA of the array substrate 2 may include more first signal lines 310 than the active region of the array substrate 1. As a consequence, a utilization rate of the space of the peripheral region RA of the display panel becomes more important to the array substrate 2.

In the embodiment, each sub-pixel SPX is located between two corresponding adjacent first signal lines 310. Since the resolution of the display panel is higher, the pitch B between two adjacent first signal lines 310 in FIG. 2 is smaller than the pitch B shown in FIG. 1A. Taking about 85-inch display panel as an example, the pitch B in FIG. 2 is in a range from about 81 micrometers to about 82 micrometers. However, the disclosure is not limited thereto. The distance between the centers of the adjacent transfer pads TP1 is A, and the distance A may be in a range from about 40 micrometers to about 55 micrometers. However, the disclosure is not limited thereto. Taking about 85-inch display panel as an example, there may be a total of 46,080 first signal lines (e.g., data lines) 310 and 3,840 second signal lines (e.g., scan lines) 340. In addition, each color sub-pixel (e.g., a red sub-pixel) is configured with the one-data-line-and-one-gate-line (1D1G) circuit layout. The required number of the first signal lines (e.g., data lines) 310 may be about 15,360 (about equivalent to 16K). Under such circumstances, such a display panel may be referred to as an ultra high definition (16K) display panel. However, the disclosure is not limited thereto. Taking about 85-inch display panel as an example, there may be a total of 46,080 first signal lines (e.g., data lines) 310 and 3,840 second signal lines (e.g., scan lines) 340. In addition, each color sub-pixel (e.g., a red sub-pixel) is configured with the two-data-line-and-half-gate-line (2DhG) circuit layout. The required number of the first signal lines (e.g., data lines) 310 may be about 8,000 (about equivalent to 8K). Under such circumstances, such a display panel may be referred to as an ultra high definition (8K) display panel. However, the disclosure is not limited thereto.

Figure 3:
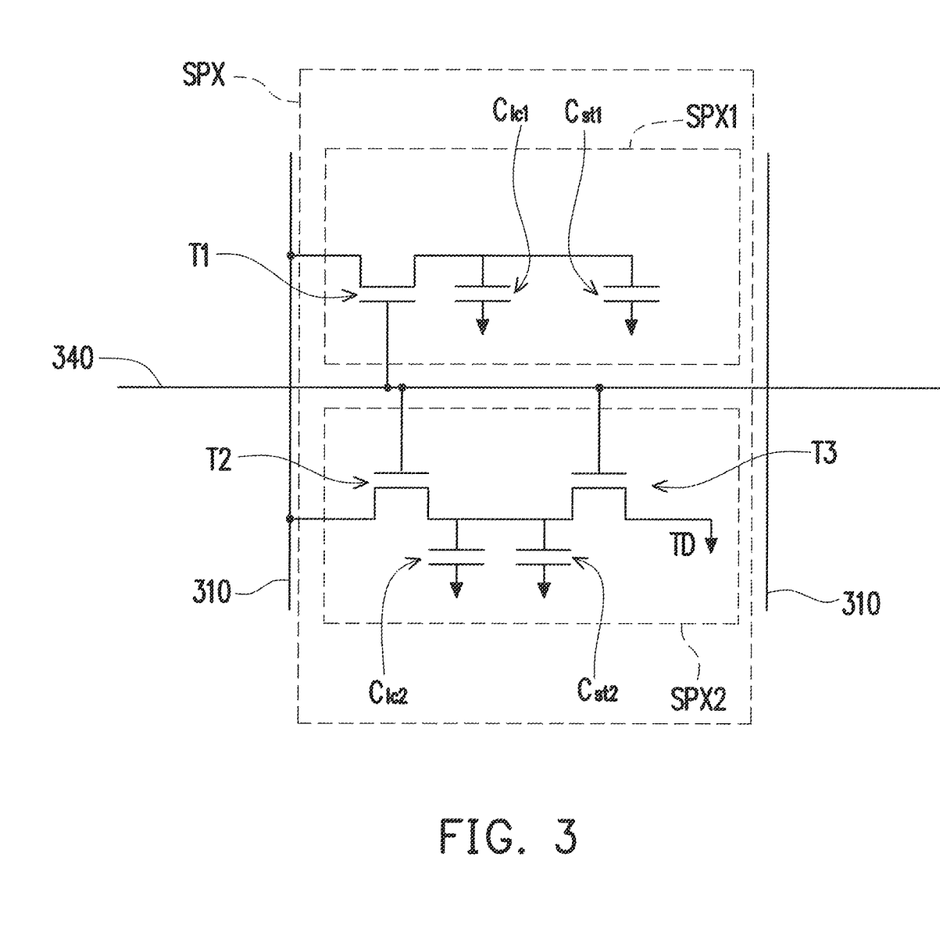
FIG. 3 is a schematic view illustrating a circuit layout of sub-pixels of FIGS. 1A and 2.

Referring to FIG. 3, FIG. 3 is a schematic view illustrating a circuit layout of the sub-pixels of FIGS. 1A and 2. At least one of the sub-pixel SPX may include a first pixel electrode SPX1, a second pixel electrode SPX2, an active device T1, an active device T2, and an active device T3. However, the disclosure is not limited thereto. In other embodiments, at least one of the sub-pixels SPX may include one of the first pixel electrode SPX1 and the second pixel electrode SPX2 and at least one of the active device T1, the active device T2, and the active device T3. In the embodiment, sources of the active device T1 and the active device T2 are electrically connected to the first signal line (e.g., data line) 310. A drain of the active device T3 is electrically connected to a common voltage signal TD. The reference potential line 328 is configured to provide the common voltage signal TD. In addition, the first reference potential line 322 is configured for the signals of the driving circuits 110 and 120 to be transmitted to the reference potential line 328. Gates of the active device T1, the active device T2, and the active device T3 are electrically connected to the second signal line (e.g., scan line) 340. In addition, the active device T1, the active device T2, and the active device T3 may be connected to the same or different second signal lines (e.g., scan lines) 340. A drain of the active device T1 is electrically connected to the first pixel electrode SPX1, and is electrically connected to a liquid crystal capacitor Clc1 and a storage capacitor Cst1. A drain of the active device T2 and a source of the active device T3 are electrically connected to the second pixel electrode SPX2, and are electrically connected to a liquid crystal capacitor Clc2 and a storage capacitor Cst2.

In the embodiment, with the turning angles 144, 146, 244, and 246, the utilization rate of the space in of the peripheral region RA in the display panel is increased. Among display panels of the same size, the display panel adopting the array substrate 2 is able to include more sub-pixels. Therefore, the resolution of the display panel is increased. In other words, since the accommodation space C is provided between the first connection lines 140 and the second connection lines 240, a desirable utilization rate of the space of the peripheral region is achieved even if the signal lines in the active region AA are increased.

In the array substrate according to the embodiments of the disclosure, the first reference potential line may be connected to the first bonding pad and the second bonding pad at the same time. Therefore, the first driving circuit and the second driving circuit are able to jointly control the signal applied to the first reference potential line. Under the circumstance, the signal of the first reference potential line is more stable, thereby rendering a desirable display quality of the display panel.

In the array substrate according to the embodiments of the disclosure, the first reference potential line is disposed in the accommodation space. Therefore, the utilization rate of the space of the peripheral region in the display panel is increased.

In the array substrate according to the embodiments of the disclosure, the turning angles are provided in the first and second connection lines. Therefore, the utilization rate of the space of the peripheral region in the display panel is further increased.

In the array substrate according to the embodiments of the invention, since the utilization rate of the space (e.g., available space) of the peripheral region is increased, the circuits required for the sub-pixels of the array substrate (e.g., the array substrate of the display panel) may still be disposed on the array substrate (e.g., the array substrate of the display panel) when the array substrate (e.g., the array substrate of the display panel) is configured for a ultra-high definition (e.g., 8K) without reducing the number of sub-pixels of the ultra-high definition (e.g., 8K). Moreover, the number of sub-pixels may be increased to make the array substrate (e.g., the array substrate of the display panel) applicable for the ultra-high definition (e.g., 16K).

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. An array substrate, comprising:
    a substrate, having an active region and a peripheral region located at at least one side of the active region;
    a plurality of first signal lines located at the active region;
    a plurality of sub-pixels located at the active region and respectively electrically connected to the first signal lines;
    a plurality of reference potential lines located at the active region;
    a first bonding pad group and a second bonding pad group separated from the first bonding pad group, wherein the first bonding pad group and the second bonding pad group are located at the peripheral region, the first bonding pad group has a plurality of first bonding pads, and the second bonding pad group has a plurality of second bonding pads;
    a plurality of first fan-out lines and a plurality of second fan-out lines, located at the peripheral region and respectively electrically connected to the first bonding pads and the second bonding pads;
    a plurality of first connection lines electrically connecting the first fan-out lines to the corresponding first signal lines;

a plurality of second connection lines electrically connecting the second fan-out lines to the corresponding first signal lines, wherein an accommodation space exists between the first connection line closest to the second bonding pads and the second connection line closest to the first bonding pads; and a first reference potential line, located at the accommodation space and electrically connected to the plurality of reference potential lines located at the active region.

2. The array substrate of claim 1, further comprising a second reference potential line, wherein the first reference potential line located at the accommodation space is electrically connected to the plurality of reference potential lines located at the active region through the second reference potential line.

3. The array substrate of claim 2, wherein the second reference potential line intersects the first signal lines.

4. The array substrate of claim 1, wherein the first signal lines comprise data lines.

5. The array substrate of claim 1, wherein the first signal lines comprise scan lines.

6. The array substrate of claim 1, further comprising:
a plurality of electronic components, located at the peripheral region, wherein a portion of the electronic components are located between the first fan-out lines and a portion of the first signal lines, and another portion of the electronic components are located between the second fan-out lines and another portion of the first signal lines.

7. The array substrate of claim 1, further comprising:
a first driving circuit electrically connected to the first bonding pad group; and
a second driving circuit electrically connected to the second bonding pad group.

8. The array substrate of claim 1, wherein the first reference potential line located at the accommodation space is electrically connected to one of the first bonding pads and one of the second bonding pads.

9. The array substrate of claim 1, wherein:
a portion of each of the first connection lines near the corresponding first signal line has at least two turning angles; and
a portion of each of the second connection lines near the corresponding first signal line has at least two turning angles.

10. The array substrate of claim 1, wherein the reference potential lines located at the accommodation space comprise a voltage dividing line.

11. The array substrate of claim 1, further comprising:
a plurality of transfer pads located at the peripheral region, wherein one ends of the first fan-out lines are connected to the first bonding pad group, and the other ends of the first fan-out lines are connected to a portion of the transfer pads, and one ends of the second fan-out lines are connected to the second bonding pad group, and the other ends of the second fan-out lines are connected to another portion of the transfer pads.

12. The array substrate of claim 11, wherein each of the first connection lines comprises a first connection portion and a first extension portion, wherein the first connection portion connects a corresponding transfer pad of the transfer pads and the first extension portion, the first extension portion connects the first connection portion and a corresponding first signal line of the first signal lines, and each of the second connection lines comprises a second connection portion and a second extension portion, wherein the second connection portion connects a corresponding transfer pad of the transfer pads and the second extension portion, and the second extension portion connects the second connection portion and a corresponding first signal line of the first signal lines.

13. The array substrate of claim 12, wherein the first connection portion and the first extension portion have a first turning angle, and the second connection portion and the second extension portion have a second turning angle.

14. The array substrate of claim 13, wherein each of the first connection lines further comprises a first turning portion, each one of two ends of the first turning portion have a turning angle, the first turning portion connects the first extension portion and a corresponding first signal line of the first signal lines, each of the second connection lines further comprises a second turning portion, each one of two ends of the second turning portion have another turning angle, and the second turning portion connects the second extension portion and a corresponding first signal line of the first signal lines.

15. The array substrate of claim 14, wherein:
one ends of the first fan-out lines connected to the first bonding pad group and one ends of the second fan-out lines connected to the second bonding pad group respectively have a first fan-out width,
the other ends of the first fan-out lines connected to at least a portion of the transfer pads and the other ends of the second fan-out lines connected to at least a portion of the transfer pads respectively have a second fan-out width,
one ends of the first turning portions connected to the first extension portions and one ends of the second turning portions connected to the second extension portions respectively have a third fan-out width,
the other ends of the first turning portions connected to the first signal lines and the other ends of the second turning potions connected to the first signal lines respectively have a fourth fan-out width, and
the fourth fan-out width is greater than the third fan-out width, the third fan-out width is greater than the second fan-out width, and the second fan-out width is greater than the first fan-out width.

* * * * *